United States Patent [19]

Flora et al.

[11] Patent Number: 4,663,544
[45] Date of Patent: May 5, 1987

[54] HIGH PERFORMANCE ANALOG GATE/ABSOLUTE VALUE CIRCUIT

[75] Inventors: Jay L. Flora, Boulder; David A. Haycock, Lakewood, both of Colo.

[73] Assignee: Ampex Corporation, Redwood City, Calif.

[21] Appl. No.: 712,493

[22] Filed: Mar. 15, 1985

[51] Int. Cl.⁴ .................. H03K 19/086; H03K 5/22
[52] U.S. Cl. ............................... 307/455; 307/243; 307/494; 307/542; 328/26
[58] Field of Search ............... 307/243, 261, 262, 455, 307/494, 542, 559, 44; 328/26

[56] References Cited

U.S. PATENT DOCUMENTS

| | | | |
|---|---|---|---|
| 3,778,646 | 12/1973 | Masaki | 307/455 |
| 3,946,246 | 3/1976 | Marley | 307/455 |
| 4,516,041 | 5/1985 | Quan | 307/262 |
| 4,517,476 | 5/1985 | Barre | 307/455 |

Primary Examiner—Stanley D. Miller
Assistant Examiner—B. P. Davis
Attorney, Agent, or Firm—George B. Almeida; Joel D. Talcott

[57] ABSTRACT

An analog gate configuration employing multiple input transistors, eliminates distortion in its output signal when switching between multiple input signals during a corresponding switch-over interval when the input transistors are sharing current, by providing circuitry for sensing the occurrence of the switch-over interval. The sensing circuitry modulates a current source during the switch-over interval to selectively increase the current to be shared by the input transistors such that the current through each input transistor is maintained constant for any transistor which contributes to the output signal.

9 Claims, 6 Drawing Figures

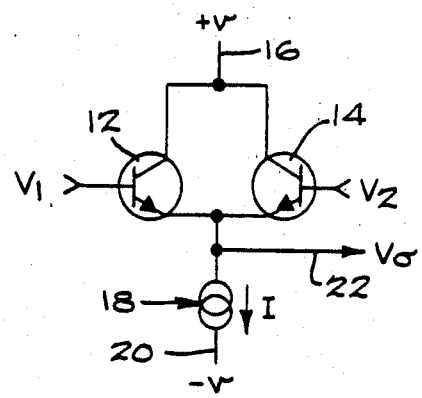
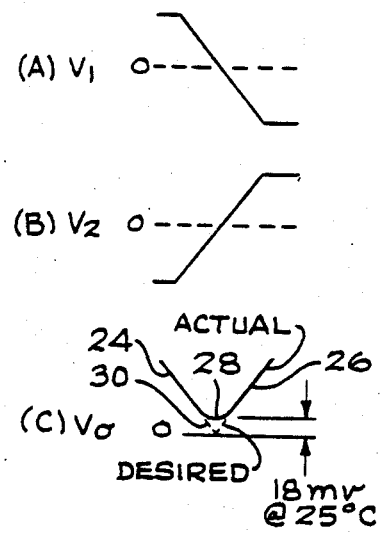
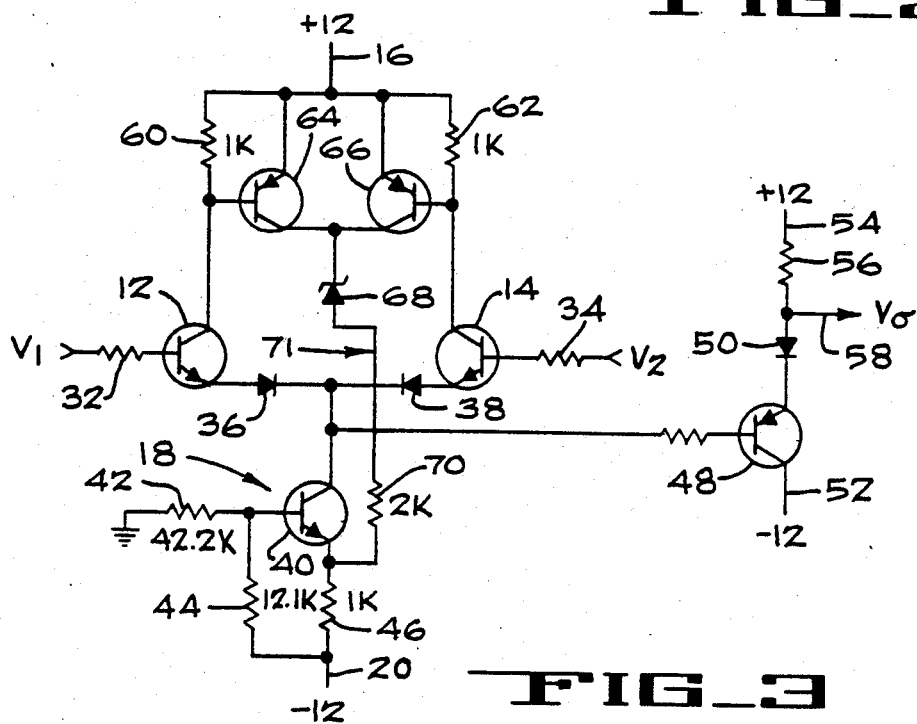
FIG_1 (PRIOR ART)
FIG_2
FIG_3

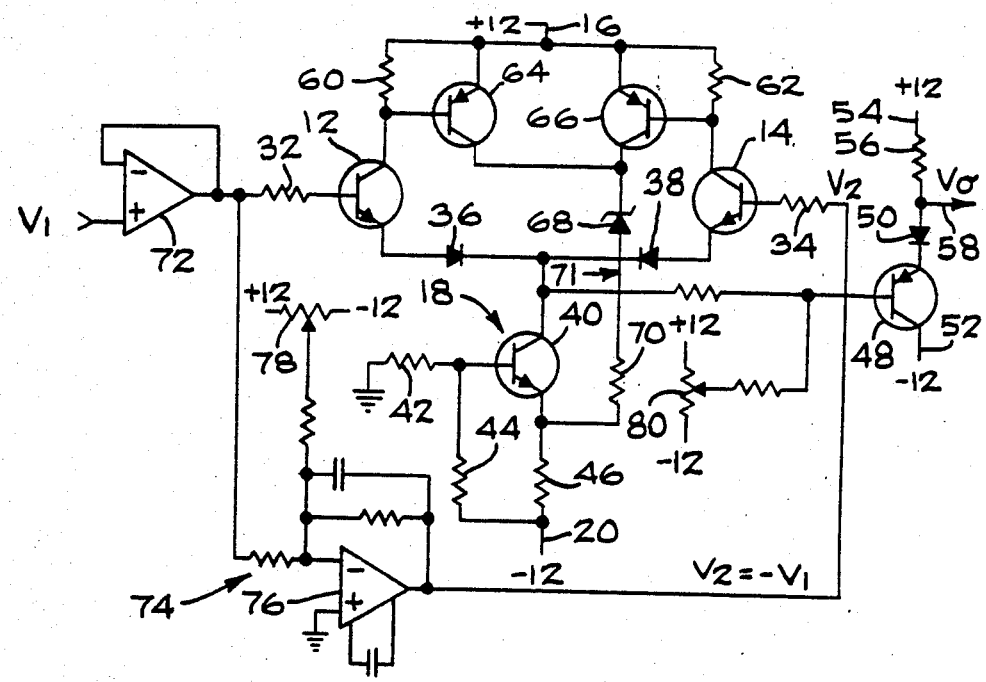
FIG_4
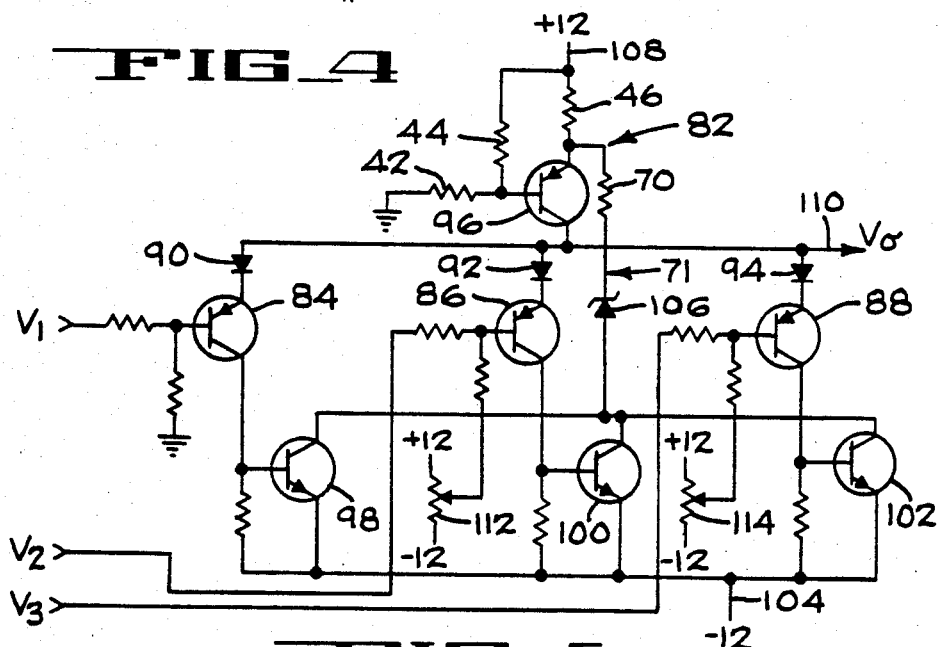
FIG_5
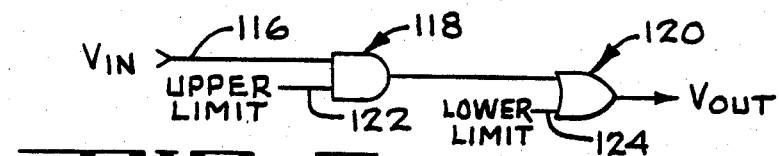
FIG_6

HIGH PERFORMANCE ANALOG GATE/ABSOLUTE VALUE CIRCUIT

The present invention relates to nonlinear analog circuits, and particularly to an improved analog gate circuit configuration capable of high frequency performance, which can also be used as an absolute value circuit. The circuit particularly is useful in the wipe system of an analog video switcher apparatus.

By way of simplifying the description, the analog gate circuit is described herein in an analog switcher environment, although there are further embodiments and more general application of all the embodiments, as further discussed below. Accordingly, the video pattern generating wipe system in an analog video switcher apparatus, which basically is an analog computer, generates various ramps and triangular waveforms, multiplies them for rotation, takes their absolute value, and processes them with analog AND/OR gates. Thus, for example, an analog OR gate may be used to provide an output which is equal to the input thereto which has the largest magnitude. On the other hand, an analog AND gate may provide an output which is the lesser of the input signal magnitudes supplied thereto. It follows that if the analog gate has any distortion in the transition region, that is, in the "switch-over" interval, when the output of the gate changes from one input to the other, it will significantly degrade the quality of the wipe pattern supplied by the system by causing a rounding of the corners and tips in the generated pattern during the corresponding switch-over. This degradation in the form of rounded corners and tips in a generated pattern readily is visible and thus is objectionable to a viewer.

More particularly, an output signal generated by a basic transistor/diode gate circuit utilizing a pair of input transistors, suffers from distortion in the transition region wherein operating conditions dictate a switch from one input to the other; that is, when the operating current is shared by the input transistors. Specifically, as is well known in the art, if the current in a p-n junction is halved, the voltage drop across the junction at room temperature decreases by 18 millivolts (mv). This condition is depicted in "Intuitive IC Op Amps" by Thomas Frederickson, R. R. Donnelley and Sons, 1984, pages 178-179 and 208-209. Such a condition causes the distortion during the transition region, which is seen as rounded corners and tips in, for example, a square, triangle, star, or other geometric pattern, or as degradation in a clock wipe in a video picture being manipulated by the switcher apparatus.

Since the signals in a pattern generating system are video signals, it is necessary that the circuitry which handles the video signals, such as analog gates, limiters and absolute value circuits, have high performance capabilities. It is found that the frequency response required to maintain the integrity of the video patterns, is of the order of the bandwidth required for video signals. Since pattern generation requires the use of analog gates and absolute value circuits to provide ramp and triangular waveforms which are then gated together, it is imperative that the gates have the requisite response while maintaining the above-mentioned distortion-free output during the switch-over from one video input to another. The present analog gate configuration provides inter alia OR and AND gates with the requisite frequency response while eliminating the distortion normally encountered during the switch-over interval.

Typical prior art schemes for improving the performance of analog gates include employing a switching element in the feedback loop of an operational amplifier, providing an "ideal diode" configuration which helps correct for the p-n voltage drop and improves the transition region distortion. However, in using an operational amplifier, the resulting circuit is limited to the bandwidth of the amplifier, and does not provide the requisite frequency response for optimum pattern integrity. Such a scheme is depicted in "Nonlinear Circuits Handbook, Engineering Staff of Analog Devices, Inc.", Norwood, Mass., USA, 1976, pages 360-363.

Another typical scheme employs hysteresis or positive feedback at the input transistors to speed up the transition or switch-over time. This confines the 18 mv rounding to a shorter interval of time which appears to improve the performance. Because of the positive feedback this scheme usually produces other frequency dependent distortion components.

A further scheme for improving the integrity of the pattern is to simply increase the levels of the waveforms entering the analog gate. This reduces the percentage of distortion since the rounding is always restricted to 18 mv. This scheme suffers from problems associated with handling large signal levels.

The present analog gate configuration circumvents the problems of the schemes of previous mention, while providing a high performance analog gate circuit of relative simplicity, which prevents distortion during the switch-over interval to preserve pattern integrity when manipulating video in switcher apparatus. Preserving the integrity of the pattern is very important in a switcher apparatus in that rounded corners and tips readily are visible to a viewer, and particularly are objectionable when a pattern is reduced in size. In the latter condition, a pattern with tips or corners loses its shape and appears merely as a round pattern or dot. By eliminating distortion, the present gate configuration allows reducing the size of a triangle to a few lines of video, or a five-point star pattern to several lines of video, while still providing the viewer with an identifiable triangle or star.

The analog gate configuration of the invention further contemplates use as a high performance absolute value circuit, as a multiple input gate, and as a hard limiter. Thus, the various embodiments may be used in more general applications where high performance is required, and are not restricted to use in pattern generation in switcher apparatus, as specifically described herein for purposes of description only.

To this end, the present analog gate circumvents degradation in performance during the transition or switch-over interval when the input stages are sharing current, by providing circuitry for modulating the current source during switch-over to selectively increase the current to be shared by the input stages. High speed switching transistors are provided which monitor the current in respective input stage transistors. Since the switching transistors monitor or sense the current in the input transistors, they are hereinafter termed "sensing" transistors. The collectors of the sensing transistors are tied together and are coupled in turn to a current source which supplies operating current to the input stage transistors. Thus when the input transistors are equally conductive, as during the switch-over interval, the sensing transistors modulate the current source output to selectively increase the current supplied to the input transistors. More particularly, in a two input gate circuit, the current is doubled so that twice the current is shared equally whereby, in turn, the current through each input transistor is always constant for the transistor (or transistors) which contributes to the output signal. It follows that if a multiple input circuit having three input signals is used, when the switchover is made between two of the three input transistors, as when two of the three inputs are substantially equal, the current source is modulated to supply twice the current to the transistors. In the event all three inputs are substantially equal, the current source supplies three times the current to the input transistors during the corresponding switch-over interval, and so on for more stages.

The invention configuration contemplates an OR gate configuration employing NPN input transistors, and respective PNP switching transistors for monitoring the currents in the input transistors. It follows that an AND gate configuration employs PNP input transistors and NPN switching transistors. In addition, an absolute value circuit is contemplated employing the OR gate configuration wherein one input to the gate is the negative of the signal supplied to the other input, that is, is of the opposite polarity. Such an absolute value circuit has a frequency response on the order of into the megaHertz region, and thus may be used in very high frequency response applications.

BRIEF DESCRIPTION OF THE DRAWINGS

FIG. 1 is a simplified schematic diagram of a typical prior art analog gate.

FIGS. 2A, 2B, 2C are a graph showing waveforms generated by the circuit of FIG. 1, and further showing the desired voltage waveform in FIG. 2C.

FIG. 3 is a schematic diagram of an analog OR gate in accordance with the invention combination.

FIG. 4 is a schematic diagram of an absolute value circuit of the invention employing the OR gate of FIG. 3.

FIG. 5 is a schematic diagram of a multiple input gate employing an AND gate configuration in accordance with the invention combination.

FIG. 6 is a simplified schematic diagram of a hard limiter circuit employing an AND gate stage and an OR gate stage in accordance with the invention combination.

DESCRIPTION OF THE PREFERRED EMBODIMENTS

Referring to FIG. 1, a typical prior art analog gate includes a pair of input transistors 12, 14, wherein the collectors are coupled to a positive voltage 16, and the bases are coupled to a first input signal $V_1$ and a second input signal $V_2$, respectively. The emitters of input transistors 12, 14 are tied together and are coupled to a current source 18 supplied by a negative voltage 20. The common emitters provide an output signal $V_0$ on an output 22. The input transistors 12, 14 are depicted in FIG. 1 as NPN transistors as employed in an OR gate configuration, wherein accordingly, the output signal $V_0$ corresponds to the larger of the input signals. In an AND gate configuration, PNP input transistors are used with the circuit inverted, wherein accordingly, the output signal $V_0$ corresponds to the smaller of the input signals.

Referring also to FIG. 2, the first input signal $V_1$ of the OR gate of FIG. 1, is depicted as a signal of decreasing value (FIG. 2A) while the second input signal $V_2$ is depicted as having an increasing value (FIG. 2B). In conventional fashion, as long as $V_1$ is greater than $V_2$, the output signal $V_0$ is the input $V_1$, and when $V_2$ becomes greater than $V_1$, the output $V_0$ becomes the input $V_2$. Thus there is a transition region, hereinafter termed a "switch-over" interval, during which the gate switches its output from one input to the other. During this "switch-over" interval, the prior art gate suffers from distortion caused by the two input transistors 12, 14 sharing the available operating current from the current source 18. More specifically, if the current in a p-n junction is halved, the voltage drop across the junction will decrease by 18 millivolts (mv) at 25° centigrade, as previously mentioned. This is depicted in FIG. 2C where $V_0$ corresponds to $V_1$ along decreasing ramp 24, and to $V_2$ along increasing ramp 26. The distortion may be seen as a rounding of the output $V_0$ during the switch-over interval, shown as numeral 28. This rounding of the output $V_0$ from the gate degrades accordingly the quality of the wipe pattern generated thereby; that is, the corners and/or tips of a pattern generated by the gate are similarly rounded. As depicted by the dashed curve 30 in FIG. 2C, it is highly desirable to provide a gate configuration wherein the output signal $V_0$ is not distorted, i.e., goes to ground, during the switch-over interval, thereby also precluding the rounding of corners or tips in the generated video pattern to significantly preserve the integrity of such patterns. As previously mentioned, such an improvement in the pattern is highly desirable.

The analog gate of FIG. 3, shown as an OR gate configuration for purposes of description only, includes the pair of NPN input transistors 12, 14 of FIG. 1, with additional similar components of the FIGS. 1 and 3 similarly numbered. The first input signal $V_1$ is supplied via a resistor 32 to the base of input transistor 12, and the second input $V_2$ is supplied via a resistor 34 to the base of input transistor 14. The emitters of the transistors 12, 14 are coupled together via respective diodes 36, 38, and thence to the collector of a transistor 40 defining the current source 18 of previous mention. Diodes 36 and 38 are used to prevent reverse base-emitter breakdown of transistors 12 and 14 when large input signal differentials are present. For small signal levels the diodes can be omitted. The base of the transistor 40 is biased negatively by a resistor divider formed by a resistor 42 and a resistor 44. The emitter is coupled to the voltage 20 via a resistor 46. The collector of transistor 40 is coupled to the base of an output transistor 48 which, along with a diode 50, defines an output stage which provides a DC signal level shift to compensate for the signal DC shift caused by the voltage drops of the input transistors 12, 14 and respective diodes 36, 38. Thus the collector of output transistor 48 is coupled to a negative voltage at 52, while the emitter is coupled to a positive voltage at 54 via a resistor 56. The emitter supplies the output signal $V_0$ at output 58. The output transistor/diode stage also advantageously provides temperature compensation for the gate circuit by tracking and cancelling the change in diode drops caused by temperature changes. In FIG. 3, the values of several resistors are included by way of example only. Furthermore, although the output signal $V_0$ is shown as derived from the output stage 48, 50, the output signal from the emitters of the input transistors 12, 14 is also distortion free, although not DC shifted.

The collectors of the input transistors 12, 14 are coupled to the positive voltage 16 via respective resistors 60, 62. The collectors are also coupled to the bases of respective PNP high speed sensing transistors 64, 66, whose emitters in turn are coupled to the voltage 16. The collectors of the sensing transistors 64, 66 are tied together and thence are coupled to the emitter of the current source transistor 40 via a zener diode 68 and a resistor 70. The zener diode/resistor comprise a feedback path 71 from the sensing transistors to the current source 18, and provide breakdown protection for the sensing transistors 64, 66, while further slowing the loop coupled to the current source to stabilize the loop and prevent oscillations. However, the zener diode/resistor components may be omitted when using sensing transistors with sufficiently large collector-emitter breakdown voltage. For example, a conductor may be used instead.

In operation, the degradation in the performance of the gate of FIG. 1 is eliminated in the improved gate of FIG. 3, by providing means for modulating the current source during the switch-over interval to supply twice as much current to the input transistors 12, 14 during switch-over. Thus, during the interval when the output of the gate is switching from one input to the other, twice as much current is shared by the two transistors, whereby the current is always constant through any transistor which contributes to the output signal. To this end, the means for modulating include means for sensing, or monitoring, the current flowing in the input transistors 12, 14, and a feedback path. It may be seen that the sensing transistor 64 and the feedback path 71 comprise a first negative feedback loop, while the transistor 66 and the feedback path 71 comprise a second negative feedback loop. Both loops are in use during the switch-over interval. When both input transistors are conducting, as during the switch-over interval, the sensing means modulate the current source 18 via the feedback path 71 to provide twice the current to the input transistors 12, 14.

More particularly, since the collector current of the input transistor is approximately equal to the emitter current thereof, sensing the collector current determines which input transistor is conducting and thus, determines when the values of $V_1$ and $V_2$ become substantially equal as during the switch-over interval. To this end, the sensing transistors 64 and 66 are coupled to sense the collector current of respective input transistors 12 and 14. The resulting negative feedback loops of previous mention act to maintain the operating current in the conducting input transistor 12 or 14 to a predetermined level, e.g., one-half milliamp ($\frac{1}{2}$ mA). If $V_1$ is much more positive than $V_2$, then the input transistor 14 is turned off and has no emitter or collector current flow, and input transistor 12 is conducting. At this time, the output signal $V_0$ corresponds to the input $V_1$. For this condition, transistor 64, the zener diode 68 and the resistor 70 provide the loop and set the current. As $V_1$ and $V_2$ become close in value, transistor 14 begins to turn on and the transistors 12 and 64 increase the current from current source 18 accordingly. At the point when $V_1$ and $V_2$ are essentially equal, both sensing transistors are conducting and the current has approximately doubled. If $V_2$ now becomes more positive than $V_1$ the negative feedback loop is now formed by transistor 66, the zener diode 68 and the resistor 70. At this time, the input signal $V_2$ essentially defines the output signal $V_0$.

Thus the input transistors share twice the current during the switch-over interval, whereby the input transistor contributing to the output signal has the same current during switch-over as it receives when it is conducting alone. This condition insures that the output signal $V_0$ on output 58 approaches the true crossover level, i.e., ground, as depicted by the dashed curve 30, FIG. 2C, thereby eliminating the distortion in the output signal $V_0$ depicted as the solid curve 28 of FIG. 2C. As a result, any rounding of the corners and tips in the generated patterns is also eliminated.

The analog OR gate of FIG. 3 provides an output which is the larger of the inputs thereto, and employs NPN input transistors 12, 14 and PNP sensing transistors 64, 66. However, the gate can readily perform an AND function, where the output is the smaller of the input signals, by using PNP input transistors 12, 14 and NPN sensing transistors and inverting the circuit, as further depicted in the multiple input gate of FIG. 5.

The gate configuration of FIG. 3 may further readily function as an absolute value circuit having very high frequency response. To this end, in FIG. 4, an absolute value circuit employs the analog OR gate configuration of FIG. 3, wherein similar components in the FIGURES are similarly numbered. As shown, the inputs to an absolute value circuit comprise a first input and a second input, wherein the latter is the negative of the first input, that is, of the opposite polarity. Thus, input signal $V_1$ is supplied to an operational amplifier buffer stage 72 and thence to the input transistor 12 via the resistor 32. In addition, $V_1$ is supplied to an inverting stage 74 formed of an operational amplifier 76, whose inverting input is also coupled to a crossover centering potentiometer 78. The latter provides for defining exactly where the crossover points of $V_1$ and $V_2$ are (at ground in the case of an absolute value circuit) and thus allows compensating for diode drop differences in the input transistor stages. The output of the inverting stage 74 is the negative of the first input $V_1$, and is supplied to the input transistor 14 via the resistor 34, as the second input $V_2$. The resulting output signal $V_0$ on output 58 is level shifted by the stage 48, 50 and is the absolute value of the input signal $V_1$. Stage 48, 50 also provides the temperature compensation of previous mention in FIG. 3. An offset adjusting potentiometer 80 provides means for correcting for DC differences between the input transistor voltage drops and the diode 36, 38 voltage drops, relative to the transistor 48 and diode 50 voltage drops. Since the circuit of FIG. 4 is, in essence, a full wave rectifier, the output signal $V_0$ is a full wave rectified version of the input signal $V_1$.

FIG. 5 depicts another embodiment contemplated by the invention combination wherein additional inputs, i.e., three or more inputs, may be switched to the output, employing a like plurality of AND gates of the invention combination. Like components in the FIGURES are similarly identified. Although the multiple input gate is described herein with three inputs, the number is limited in general only by the amount of current which can be supplied by a current source 82. The latter source is similar to the source 18 of the previous FIGURES. Accordingly, the three inputs $V_1$, $V_2$ and $V_3$ are supplied to respective AND gate configurations, and particularly to respective PNP input transistors 84, 86, 88. The emitters of the input transistors are tied together via respective diodes 90, 92, 94 and thence to the collector of a PNP transistor 96 of the current source 82. The collectors of each input transistor are coupled to respective NPN sensing transistors 98, 100, 102 whose emitters are tied together and thence coupled to a negative voltage 104. The collectors of the sensing transistors are tied together and are coupled to the emitter of the transistor 96 via the feedback path 71 formed of a zener diode 106 and the resistor 70, as depicted in the previous FIGURES. The emitter of transistor 96 is coupled to a positive voltage 108, and the base thereof is positively biased by divider resistors 42, 44. As may be seen, the AND gate configuration is provided by PNP input transistors and NPN sensing transistors, wherein the circuit is inverted relative to the positive and negative voltages. Thus the multiple input gate of FIG. 5 provides an output signal $V_O$ on an output 110, which corresponds to the smaller of the input signals $V_1$, $V_2$ and $V_3$. If all three inputs approach equality together, then the current source 82 supplies three times the bias current to the three input transistors 84, 86, 88 to prevent degrading the output $V_O$ as previously described. Channel matching potentiometers 112 and 114 are coupled to the bases of respective input transistors 86 and 88, and compensate for any differences in the voltage drops of the input transistors 84, 86, 88 and their associated diodes 90, 92, 94.

Obviously, as previously discussed, the multiple input gate configuration of FIG. 5 may employ OR gates as in FIGS. 3 and 4, wherein accordingly the output $V_O$ corresponds to the input with the largest magnitude. Further, if additional inputs and corresponding channels are desired, the circuit is readily modified by adding another stage formed of an input transistor and a respective sensing transistor, etc., for each additional input.

FIG. 6 depicts yet another embodiment of the invention combination, illustrating two stages of a hard limiter circuit which may be used to clamp both ends of an input signal $V_{in}$ supplied on an input 116. Although a two stage limiter is shown which limits both ends of an input signal, a single stage may be used to clamp the input signal $V_{in}$ at a single selected end. Input 116 is coupled to one input of an AND gate 118 of, for example, the configuration depicted in two transistor stages of the multiple AND gate of FIG. 5. The output of AND gate 118 is coupled to one input of an OR gate 120 of, for example, the configuration depicted in the OR gate configuration of FIGS. 3 and 4. The second input 122 of the AND gate 118 is supplied with a voltage level corresponding to the desired upper limit. The second input 124 of the OR gate 120 then is supplied with a voltage level corresponding to the desired lower limit. Thus the FIG. 6 limiter provides for limiting at both ends of an input signal $V_{in}$. By way of example only, if $V_{in}$ swings from $-5.0$ volts to $+5.0$ volts, and the desired lower and upper voltage limits are $-3.0$ volts to $+3.0$ volts respectively, the voltage supplied to the input 122 of the AND gate 118 is selected at $+3.0$ volts. The voltage supplied to the reference input 124 of OR gate 120 is selected at $-3.0$ volts. Since the output of the AND gate 118 is the smaller of the two inputs thereto, it prevents the output signal from exceeding $+3.0$ volts. Likewise, the resulting signal fed to the OR gate 120, is clamped to $-3.0$ volts whereby the OR gate prevents the output signal $V_{out}$ from passing $-3.0$ volts. Since neither of the gates generate distortion in the output signal during the switch-over interval as previously discussed, the limiter depicted in FIG. 6 provides an output signal with no distortion at the limiting levels.

Although the sensing means for monitoring the current through the input transistors is herein depicted as the high speed transistors 64, 66, any suitable current sensing element may be used. Such elements may couple to a summing junction, wherein the resulting modulating signal is fed as by the path 71 to control the current source as discussed previously.

Accordingly, it may be seen that the invention combination contemplates an improved analog gate configuration which may be used in various analog circuitry to significantly improve the performance thereof while simplifying the circuitry.

What is claimed is:

1. A gate circuit for generating an output signal corresponding to one of multiple input signals and for switching between the multiple input signals during a switch-over interval corresponding to at least two input signals being essentially of equal magnitude, comprising:
   multiple input transistors for receiving respective input signals of the multiple input signals, and having respective emitters and collectors;
   current source transistor means including a collector operatively coupled to the input transistor emitters for supplying operating current thereto, and further having an emitter;
   multiple sensing transistors having respective collectors and coupled to monitor the current in respective input transistor collectors, and to supply via the collectors thereof a modulating signal in response to the occurrence of the switch-over interval;
   a feedback path coupled from the sensing transistor collectors to the emitter of the current source transistor means; and
   said output signal being supplied at the emitters of the multiple input transistors.

2. The gate circuit of claim 1 including:
   an output transistor stage coupled to the input transistor emitters for DC shifting the output signal to compensate for voltate drops and temperature variations associated with the input transistors.

3. The circuit of claim 1 wherein:
   the multiple sensing transistors each have respective bases and emitters responsive to the current in respective input transistor collectors; and
   wherein the collector of each sensing transistor is coupled by a respective feedback path to the current source transistor means.

4. The circuit of claim 1 wherein the feedback path includes a zener diode to provide breakdown protection for the multiple sensing transistors while stabilizing the feedback path.

5. A circuit for selecting an output signal corresponding to one of multiple input signals by switching between the multiple input signals during a switch-over interval, comprising:
   current source means;
   multiple input transistors for receiving respective input signals and coupled to share a preselected operating current from the current source means upon the occurrence of the switch-over interval when at least two input signals are substantially the same;
   multiple current sensing transistors each coupled to monitor the current in a respective input transistor of the multiple input transistors and for supplying a modulating signal to the current source means in response to the occurrence of the switch-over interval when the two input signals are substantially the same; and
   a feedback path integral with each of the multiple current sensing transistors for cooperatively supplying the modulating signal to the current source means to selectively increase the operating current from the current source means and maintain constant the preselected operating current shared by the input transistors.

6. The circuit of claim 5 further including:

a first input transistor for receiving a first input signal;

signal inverting means disposed to also receive the first input signal and for generating an inverted first input signal;

a second input transistor for receiving the inverted first input signal; and wherein the output signal is the absolute value of the first input signal.

7. A circuit for selecting an output signal corresponding to one of multiple input signals by switching between the multiple input signals during a switch-over interval, comprising:

current source means;

multiple input transistors for receiving respective input signals and coupled to share a preselected operating current from the current source means upon the occurrence of the switch-over interval;

multiple current sensing means coupled to monitor respective input tranistors for supplying a modulating signal to the current source means in response to sensing the occurrence of the switch-over interval;

feedback loop means integral with the multiple current sensing means for supplying the modulating signal to the current source means to selectively increase the operating current from the current source means to maintain constant the current shared by the input transistors during the switch-over interval;

wherein the multiple input transistors comprise at least three input transistors for receiving at least three respective input signals;

said feedback loop means including at least three sensing transistors, each coupled to monitor a respective input transistor;

said sensing transistors being coupled to the current source means to supply thereto the modulating signal during the switch-over interval; and said output signals corresponding to one of the three input signals.

8. A circuit for selecting an output signal corresponding to one of multiple input signals by switching between the mulitple input signals during a switch-over interval, comprising:

current source means;

multiple input transistors for receiving respective input signals and coupled to share a preselected operating current from the current source means upon the occurrence of the switch-over interval;

multiple current sensing means coupled to monitor respective input transistors for supplying a modulating signal to the current source means in response to sensing the occurrence of the switch-over interval;

feedback loop means integral with the multiple current sensing means for supplying the modulating signal to the current source means to selectively increase the operating current from the current source means to maintain constant the current shared by the input transistors during the switch-over interval;

the circuit further including:

a first stage of PNP input transistors configured as an AND gate having a pair of inputs;

a first AND gate input coupled to a first input signal;

a second AND gate input coupled to a selected upper limit voltage level; and the AND gate having an output signal clamped at the selected upper limit voltage level.

9. The circuit of claim 8 further including:

a second stage of NPN input transistors configured as an OR gate having a pair of inputs;

a first OR gate input coupled to the output signal of the AND gate;

a second OR gate input coupled to a selected lower limit voltage level; and the OR gate having an output signal clamped at the selected upper and lower limit voltage levels.

* * * * *